(12) United States Patent
Ziazadeh

(10) Patent No.: US 7,525,348 B1
(45) Date of Patent: Apr. 28, 2009

(54) DIFFERENTIAL VOLTAGE COMPARATOR

(75) Inventor: Ramsin M. Ziazadeh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 140 days.

(21) Appl. No.: 10/907,871

(22) Filed: Apr. 19, 2005

(51) Int. Cl.
*H03K 5/22* (2006.01)

(52) U.S. Cl. .................. 327/65; 327/103; 327/108; 327/379

(58) Field of Classification Search .............. 327/52, 327/54–57, 65, 74, 76
See application file for complete search history.

(56) References Cited

U.S. PATENT DOCUMENTS

| | | | | |
|---|---|---|---|---|
| 5,140,188 | A  * | 8/1992 | Burns | 327/78 |
| 6,504,499 | B1 * | 1/2003 | Masenas et al. | 341/155 |
| 6,703,871 | B2 * | 3/2004 | You et al. | 327/52 |
| 7,151,475 | B2 * | 12/2006 | Boemler | 341/155 |
| 2003/0011247 | A1 * | 1/2003 | Kajiwara et al. | 307/125 |
| 2003/0058046 | A1 * | 3/2003 | Moon | 330/250 |
| 2004/0027185 | A1 * | 2/2004 | Fiedler | 327/211 |
| 2005/0099233 | A1 * | 5/2005 | Zipper et al. | 330/261 |

* cited by examiner

*Primary Examiner*—Long Nguyen
*Assistant Examiner*—Ryan C Jager
(74) *Attorney, Agent, or Firm*—Vedder Price P.C.

(57) ABSTRACT

A circuit and method for comparing and providing a signal indicative of a difference in magnitude between a differential signal voltage and a differential reference voltage.

16 Claims, 3 Drawing Sheets

DIFFERENTIAL VOLTAGE COMPARATOR

BACKGROUND OF THE INVENTION

The present invention relates to voltage comparator circuits, and in particular, to fully differential voltage comparator circuits.

As the density of a typical integrated circuit (IC), or chip, continues to increase, increasing numbers of complex circuit functions are being integrated into each single chip. As the prices for such chips have declined, sometimes dramatically, this has become increasingly problematic from the standpoint of production costs, since such increasingly complex chips become more difficult and often, therefore, more costly to adequately test for defects. As a result, it has become increasingly common for chips to include some form of built-in system test (BIST) circuitry for performing internal testing of various portions of the integrated circuit to provide some form of output status signals indicative of any defects or performance problems. This advantageously allows for the use of simpler and typically less costly external automatic test equipment (ATE), as well as reduced testing times.

SUMMARY OF THE INVENTION

In accordance with the presently claimed invention, a circuit and method are provided for comparing and providing a signal indicative of a difference in magnitude between a differential signal voltage and a differential reference voltage.

In accordance with one embodiment of the presently claimed invention, differential voltage comparator circuitry for comparing a differential signal voltage to a differential reference voltage includes input and reference electrodes, voltage-to-current conversion circuitry and current-to-voltage conversion circuitry. Conveyed via first and second input electrodes is a differential signal voltage with first and second phases. Conveyed via first and second reference electrodes is a differential reference voltage with first and second phases. The voltage-to-current conversion circuitry is coupled to the first and second input electrodes and to the first and second reference electrodes, and responsive to the differential signal and reference voltages by providing first and second output currents related to first and second summations of the first and second differential signal and reference voltage phases, respectively. The current-to-voltage conversion circuitry is coupled to the voltage-to-current conversion circuitry and responsive to the first and second output currents by providing a differential output voltage with first and second phases indicative of a difference in magnitude between the differential signal and reference voltages.

In accordance with another embodiment of the presently claimed invention, differential voltage comparator circuitry for comparing a differential signal voltage to a differential reference voltage includes voltage-to-current converter means and current-to-voltage converter means. The voltage-to-current converter means is for receiving a differential signal voltage with first and second phases and a differential reference voltage with first and second phases, and in response thereto providing first and second output currents related to first and second summations of the first and second differential signal and reference voltage phases, respectively. The current-to-voltage converter means is for receiving the first and second output currents and in response thereto providing a differential output voltage with first and second phases indicative of a difference in magnitude between the differential signal and reference voltages.

In accordance with still another embodiment of the presently claimed invention, a method for comparing a differential signal voltage to a differential reference voltage includes:

receiving a differential signal voltage with first and second phases;

receiving a differential reference voltage with first and second phases;

converting the first and second differential signal voltage phases to first and second signal currents;

converting the first and second differential reference voltage phases to first and second reference currents;

summing the first signal and reference currents to provide a first output current;

summing the second signal and reference currents to provide a second output current; and converting the first and second output currents to a differential output voltage with first and second phases indicative of a difference in magnitude between the differential signal and reference voltages.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
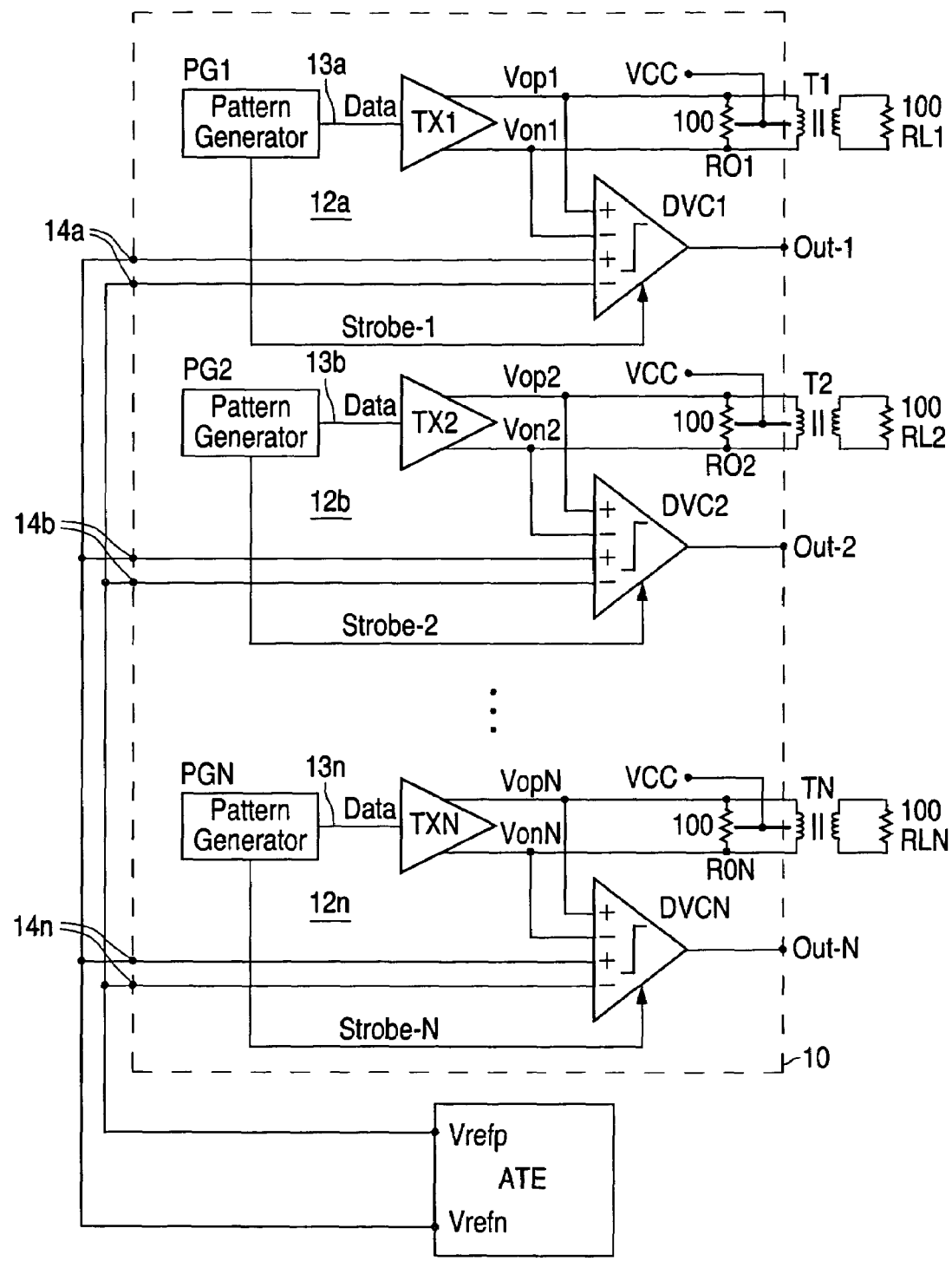
FIG. 1 is a block diagram of an integrated circuit with built-in test circuitry in accordance with one embodiment of the presently claimed invention.

Referring to FIG. 1, an integrated circuit 10 with differential signal generator circuitry and built-in test circuitry includes multiple subcircuits 12a, 12b, ..., 12n, each of which includes a differential signal generator circuit TX1, TX2, ..., TXN for generating differential output signals. One example of such circuitry would be a 100 BASE-T Ethernet transmitter circuit which provides a fully differential output signal having a peak-to-peak signal amplitude, according to the IEEE compliance specification, of 1,000+/−50 millivolts.

Referring to the first subcircuit 12a as an example (with it understood that each of the remaining subcircuits 12b, ..., 12n operates in a similar manner), the differential signal generator circuit TX1 generates a differential output signal having positive VOP1 and negative VON1 signal phases which are applied across an output resistance RO1 (e.g., 100 ohms) in parallel with the primary side of an isolation transformer T1 (off-chip), the secondary side of which drives a load resistance RL1 (e.g., 100 ohms). The output terminals of the differential signal generator TX1 are biased with the power supply voltage VCC, which is applied at the midpoints of the output resistance RO1 and the primary side of the transformer T1. Such circuitry is well known in the art and need not be described further. Under normal operating conditions, the differential signal generator TX1 receives a single ended input signal generated elsewhere within the chip 10 for transmission off-chip as the differential output signal VOP1-VON1. One example of such differential signal generators is a low voltage differential signaling (LVDS) interface circuit, many types of which are well known in the art.

For purposes of a built-in test function, also included as part of this subcircuit 12a is a pattern generator PG1 which can be virtually any form of storage or memory circuitry in which data having a predetermined bit pattern can be stored and provided in an appropriately synchronous manner as a data signal 13a to the differential signal generator TX1. This input data signal 13A will produce a corresponding differential output signal VOP1−VON1, the magnitude of which is tested by the built-in test circuitry.

This built-in test circuitry is formed primarily by a differential voltage comparator circuit DVC1 which compares the differential output signal VOP1−VON1 to a differential reference voltage VREFP-VREFN having upper and lower reference voltage values VREFP and VREFN, respectively, relative to circuit ground potential. Various forms of differential voltage comparator circuits are well known in the art. A preferred implementation of such a differential voltage comparator circuit is described in more detail below.

The pattern generator PG1 also produces a synchronizing control signal STROBE-1 to synchronize the operation of the differential voltage comparator circuit DVC1 to the occurrence of the differential output signal VOP1−VON1 corresponding to the patterns of the data signal 13a provided by the pattern generator PG1.

The reference voltages VREFP, VREFN are provided by test equipment ATE external to the chip 10, and are made available to the built-in test circuitry by way of electrodes 14a, 14b, ..., 14n. It will be understood by one of ordinary skill in the art that these electrodes 14a, 14b, ..., 14n need not necessarily be electrodes dedicated to conveying these reference voltages VREFP, VREFN, but may electrodes shared among various forms of switching or multiplexing circuitry, thereby allowing such electrodes 14a, 14b, ..., 14n to be used for other functions as well. Such reference voltages VREFP, VREFN should have high accuracy and stability, and can be generated in many ways well known in the art. For example, bandgap reference voltage generators, which are well known in the art, can be used to generate reference voltages which can then be amplified or attenuated in precision manners to produce the desired values for these particular reference voltages VREFP, VREFN.

Figure 2:
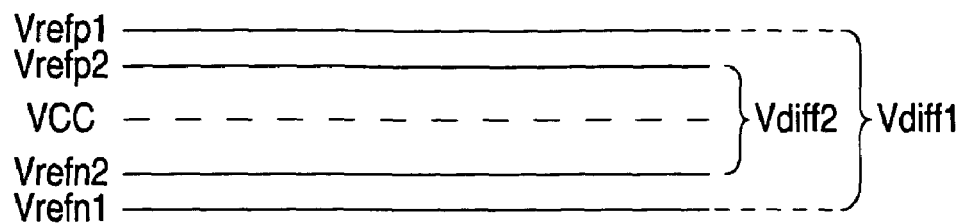
FIG. 2 is a diagram depicting the alternate reference voltages for performing differential signal testing in accordance with the presently claimed invention.

Referring to FIG. 2, the reference voltages VREFP, VREFN advantageously include multiple voltage values, thereby allowing the differential output voltage VOP1-VON1 to be tested for compliance with a specified window of voltage values. For example, as noted above, the IEEE compliance specification for 100 BASE-T Ethernet transmitters requires a differential signal voltage to have a magnitude of 1,000+/−50 millivolts. Accordingly, as shown in FIG. 2, the two sets of reference voltages VREFP1, VREFN1 and VREFP2, VREFN2 would have voltage values such that their differential voltage magnitudes would be 1,050 and 950 millivolts, respectively. In other words, the first set of reference voltages VREFP1, VREFN1 would have respective voltage values, relative to the nominal power supply voltage VNOM VCC (due to its application via the primary winding of the transformer T1) from which the individual reference voltages VREFP1, VREFN1 are equidistant, such that the difference between these reference voltages VDIFF1=VREFP1−VREFN1 is 1,050 millivolts. Similarly, for the second set of voltage VREFP2, VREFN2, their respective voltage values would be such that the difference between them VDIFF2=VREFP2=VREFN2 is 950 millivolts. Using such a dual set of reference voltages VREFP1, VREFN1 and VREFP2, VREFN2, it can then be determined whether the differential signal being tested has a magnitude within a windowed specification, such as the IEEE specification for 100 BASE-T Ethernet.

Figure 3:
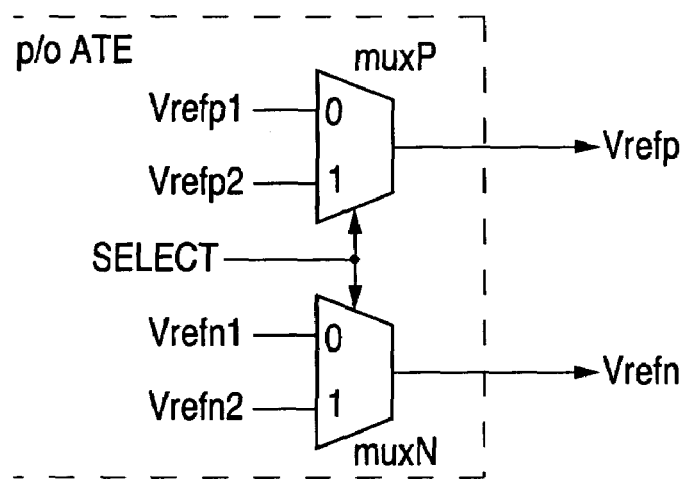
FIG. 3 is a block diagram of multiplexing circuitry for use with the circuit of FIG. 1.

Referring to FIG. 3, such multiple ranges of reference voltages VREFP, VREFN can be provided by generating the individual reference voltages VREFP1, VREFN1, VREFP2, VREFN2 and providing them as the selected reference voltages VREFP, VREFN for use by the digital voltage comparator circuits DVC1, DVC2, ..., DVCN, e.g., using analog switching or multiplexing circuits within the external test equipment ATE. For example, to provide the two sets of reference voltages VREFP2, VREFN1 and VREFP2, VREFN2, as discussed above for FIG. 2, analog multiplexors MUXP, MUXN can be used as shown. The first multiplexor MUXP is used to select between the two upper reference voltages VREFP1, VREFP2, while the other multiplexor MUXN is used to select between the two lower reference voltages VREFN1, VREFN2, in accordance with a control signal SELECT. Such analog switching and multiplexing circuitry is well known in the art and need not be described further.

Figure 4:
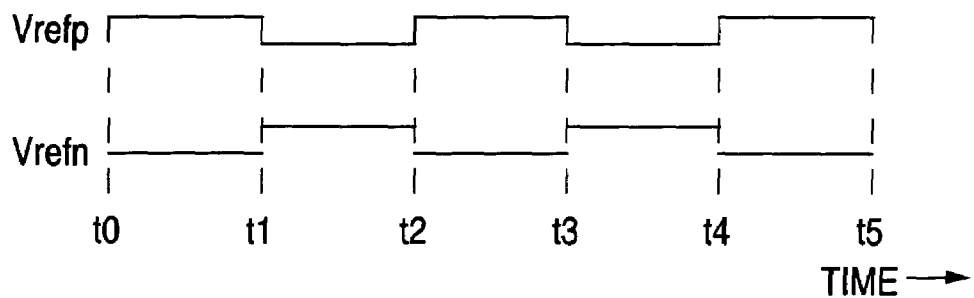
FIG. 4 is a diagram depicting voltage versus time for the multiplexed reference voltages provided by the circuit of FIG. 3.

Referring to FIG. 4, providing multiplexed voltages VREFP, VREFN in the manner discussed above allows the differential signal under test to be tested for compliance with the maximum and minimum differential voltage magnitudes. For example, during time intervals t0-t1, t2-t3 and t4-t5, the multiplexed reference voltages VREFP, VREFN are at their outermost extreme values, relative to their nominal mean voltage VNOM value VCC (FIG. 2), thereby allowing the differential signal magnitude to be tested for compliance with the maximum voltage magnitude. Conversely, during time intervals t1-t2 and t3-t4, the multiplexed reference voltages VREFP, VREFN are at their innermost extremes, relative to their nominal mean voltage VNOM value VCC, thereby allowing the differential signal magnitude to be tested for compliance with the minimum voltage magnitude.

Figure 5:
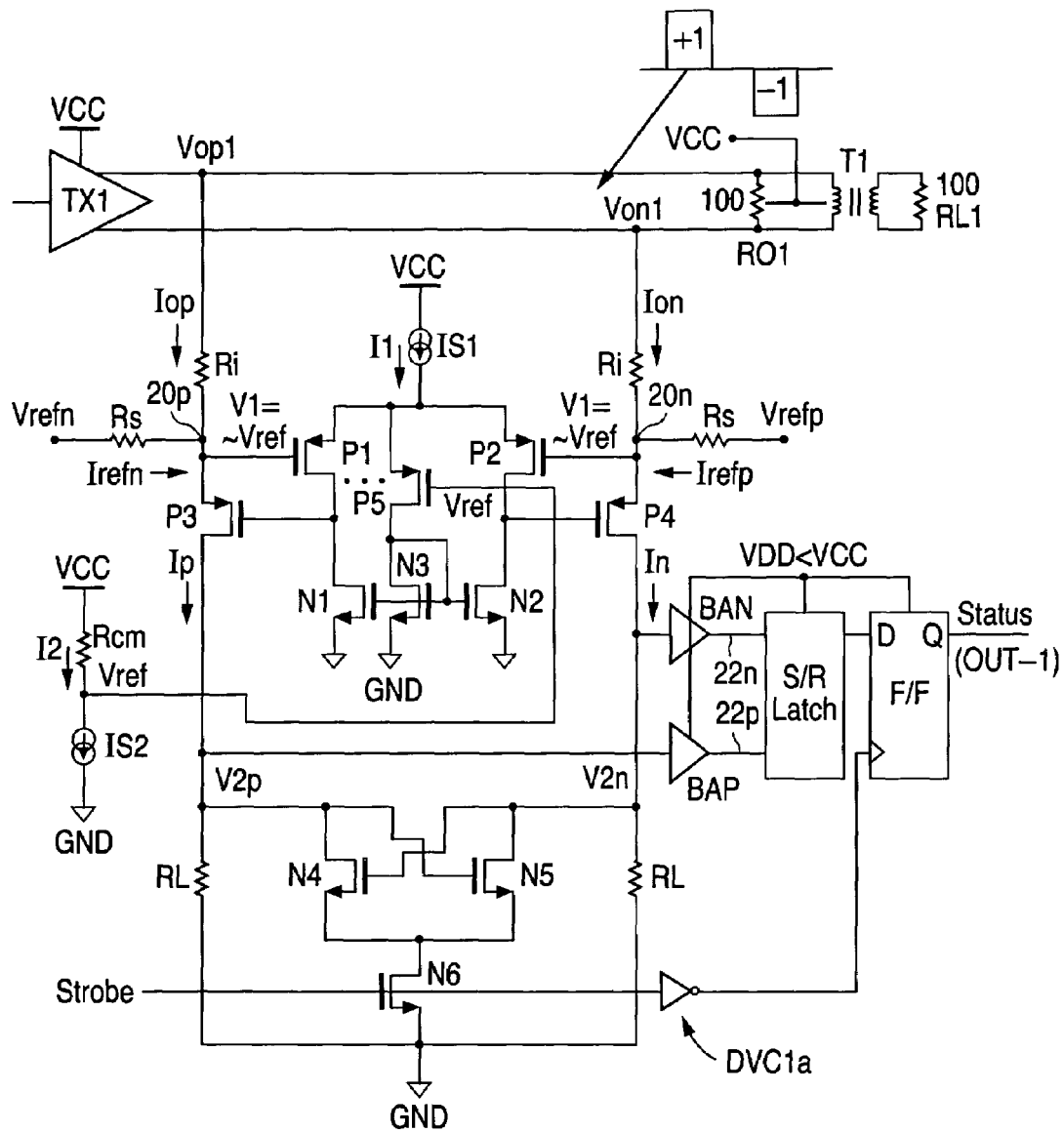
FIG. 5 is a schematic diagram of a differential voltage comparator circuit in accordance with one embodiment of the presently claimed invention.

Referring to FIG. 5, a preferred embodiment DVC1A of the differential voltage comparator circuit is implemented as shown and described below. Since the external reference voltages VREFP, VREFN are provided by external circuitry, i.e., off-chip, it is important that the digital voltage comparator circuitry reject common mode noise, such as that produced by the reference voltage generator itself or by being induced due to the internal routing of the reference voltages within the chip. It is also important to compensate or avoid mismatches due to voltage translations necessary within the comparator circuitry to operate the transistors within their proper operating voltage ranges. This can be problematic due to the fact that the output terminals of the differential signal generator TX1 are generally biased to the highest power supply voltage VCC that also serves as the power supply for the chip via the center tap of the primary side of the transformer T1.

A voltage regulator is provided in the form of P-type metal oxide semiconductor field effect transistors (P-MOSFETs) P1, P2, P3, P4, P5 and N-MOSFETs N1, N2, N3, all interconnected substantially as shown. A tail current I1 is provided by a current source IS1 for transistors P1, P2, and P5. Transistor P5 is biased by a reference voltage VREF generated across a current source IS2 which sinks a current I2 through an on-chip resistance RCM. Output transistors P3, P4 complete this voltage regulator structure.

Nodes 20P and 20N provide low impedance current summing nodes. Accordingly, incoming currents IOP, ION, IREFP and IREFN are generated by the application of the differential signal voltage phases VOP1 and VON1, and reference voltages VREFP and VREFN, respectively, to their respective input resistors RI, RS. Currents IOP and IREFN sum together to produce output current IP through transistor P3. Similarly, currents ION and IREFP sum together to produce output current IN through transistor P4. These currents IP and IN flow through equal resistances RL, thereby producing corresponding voltages V2P and V2N at the drain terminals of N-MOSFETs N4 and N5, respectively. Transistors N4 and N5 operate as a bistable multivibrator circuit which provides a high gain positive feedback latching function initiated by N-MOSFET N6 when turned on by the strobe signal. The resulting node voltages V2P and V2N are buffered by amplifiers BAP and BAN, respectively, with the buffered voltages 22P, 22N being applied to a set-reset latch, the output of which can be captured by a D-type flip-flop triggered by the inverse of the strobe signal. The resulting output status signal can be used as the output signal OUT-1 to be provided off-chip for monitoring by the test circuitry ATE, as discussed above.

The various on-chip resistances RI, RS, RL, RCM are preferably implemented as polysilicon resistors. Accordingly, the various currents IOP, ION, IREFP, IREFN, IP, IN will be proportional to variations in the polysilicon resistances over process and temperature variations, provided the summing node voltages V1 and transmitter output voltages VOP1, VON1 refer to the same power supply voltage VCC. Additionally, the steady state values for voltages V2P and V2N can be set to a constant value of the lower power supply voltage VDD for the output test signal OUT-1, thereby providing for the voltage translation of the output test signal. (Typical values for the higher VCC and lower VDD power supply voltages are 2.5 and 1.0 volts, respectively.)

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including differential voltage comparator circuitry for comparing a differential signal voltage to a differential reference voltage, wherein said differential voltage comparator circuitry comprises:

first and second input electrodes via which is conveyed said differential signal voltage with first and second phases that are alternately more positive and negative than a mean voltage;

first and second reference electrodes via which is conveyed said differential reference voltage with first and second phases that are more positive and negative, respectively, than said mean voltage;

voltage regulation circuitry responsive, substantially independently from said differential signal voltage, to a power supply voltage by providing an internal reference voltage;

voltage-to-current conversion circuitry coupled to said voltage regulation circuitry, said first and second input electrodes and to said first and second reference electrodes, and responsive, substantially independently from a differential output voltage, to said internal reference voltage, said differential signal voltage and said differential reference voltage by providing a first output current related to a first summation of said first differential signal voltage phase and said second differential reference voltage phase, and providing a second output current related to a second summation of said second differential signal voltage phase and said first differential reference voltage phase; and current-to-voltage conversion circuitry coupled to said voltage-to-current conversion circuitry and responsive to said first and second output currents by providing said differential output voltage with first and second phases indicative of a difference in magnitude between said differential signal and reference voltages.

2. The apparatus of claim 1, wherein said voltage-to-current conversion circuitry comprises:

resistive circuitry coupled to said first and second input electrodes and to said first and second reference electrodes, and responsive to said differential signal and reference voltages by providing first and second intermediate currents corresponding to said first and second summations; and amplifier circuitry coupled to said resistive circuitry and responsive to said first and second intermediate currents by providing said first and second output currents.

3. The apparatus of claim 1, wherein said current-to-voltage conversion circuitry comprises bistable multivibrator circuitry.

4. The apparatus of claim 1, wherein said current-to-voltage conversion circuitry comprises:

resistive circuitry coupled to said voltage-to-current conversion circuitry;

bistable multivibrator circuitry coupled to said resistive circuitry; and switching circuitry coupled to said bistable multivibrator circuitry.

5. The apparatus of claim 1, wherein said differential voltage comparator circuitry further comprises signal conversion circuitry, coupled to said current-to-voltage conversion circuitry, and responsive to said differential output voltage by providing a corresponding single ended signal.

6. The apparatus of claim 5, wherein said signal conversion circuitry comprises latching circuitry responsive to reception of a control signal by providing said single ended signal with a value corresponding to said differential output voltage.

7. The apparatus of claim 1, wherein said voltage regulation circuitry comprises:
   current source circuitry to provide a reference current; and
   conversion circuitry responsive to said reference current by providing said internal reference voltage.

8. An apparatus including differential voltage comparator circuitry for comparing a differential signal voltage to a differential reference voltage, wherein said differential voltage comparator circuitry comprises:
   voltage regulator means for responding, substantially independently from said differential signal voltage, to a power supply voltage by providing an internal reference voltage, and first and second related reference voltages;
   voltage-to-current converter means for receiving said differential signal voltage with first and second phases that are alternately more positive and negative than a mean voltage, and said differential reference voltage with first and second phases that are more positive and negative, respectively, than said mean voltage, and in response thereto, substantially independently from a differential output voltage, providing, at said first related reference voltage, a first output current related to a first summation of said first differential signal voltage phase and said second differential reference voltage phase, and providing, at said second related reference voltage, a second output current related to a second summation of said second differential signal voltage phase and said first differential reference voltage phase; and
   current-to-voltage converter means for receiving said first and second output currents and in response thereto providing said differential output voltage with first and second phases indicative of a difference in magnitude between said differential signal voltage and at least one of said first and second related reference voltages.

9. The apparatus of claim 8, further comprising signal converter means for receiving said differential output voltage and in response thereto providing a corresponding single ended signal.

10. A method for comparing a differential signal voltage to a differential reference voltage, comprising:
   receiving said differential signal voltage with first and second phases that are alternately more positive and negative than a mean voltage;
   receiving said differential reference voltage with first and second phases that are more positive and negative, respectively, than said mean voltage;
   providing, substantially independently from said differential signal voltage, an internal reference voltage, and first and second related reference voltages;
   converting said first and second differential signal voltage phases to first and second signal currents, respectively;
   converting said first and second differential reference voltage phases to first and second reference currents, respectively;
   summing said first signal current and said second reference current to provide, substantially independently from a differential put voltage, a first output current at said first related reference voltage;
   summing said second signal current and said first reference current to provide, substantially independently from said differential output voltage, a second output current at said second related reference voltage; and
   converting said first and second output currents to said differential output voltage with first and second phases indicative of a difference in magnitude between said differential signal voltage and at least one of said first and second related reference voltages.

11. The method of claim 10, wherein:
   said converting said first and second differential signal voltage phases to first and second signal currents comprises applying said first and second differential signal voltage phases to a first portion of resistive circuitry to produce a first intermediate current;
   said converting said first and second differential reference voltage phases to first and second reference currents comprises applying said first and second differential reference voltage phases to a second portion of said resistive circuitry to produce a second intermediate current;
   said summing said first signal and reference currents to provide, substantially independently from said differential output voltage, a first output current comprises summing said first signal and reference currents in a first portion of amplifier circuitry; and
   said summing said second signal and reference currents to provide, substantially independently from said differential output voltage, a second output current comprises summing said second signal and reference currents in a second portion of said amplifier circuitry.

12. The method of claim 10, wherein said converting said first and second output currents to said differential output voltage with first and second phases comprises conducting at least one of said first and second output currents with bistable multivibrator circuitry.

13. The method of claim 10, wherein said converting said first and second output currents to said differential output voltage with first and second phases comprises:
   conducting one of said first and second output currents with resistive circuitry;
   conducting another of said first and second output currents with bistable multivibrator circuitry; and
   selectively enabling said bistable multivibrator circuitry.

14. The method of claim 10, further comprising converting said differential output voltage to a corresponding single ended signal.

15. The method of claim 14, wherein said converting said differential output voltage to a corresponding single ended signal comprises latching, in response to a control signal, said single ended signal with a value corresponding to said differential output voltage.

16. The method of claim 10, wherein said providing an internal reference voltage comprises:
   receiving a reference current; and
   converting said reference current to said internal reference voltage.

* * * * *

UNITED STATES PATENT AND TRADEMARK OFFICE
CERTIFICATE OF CORRECTION

PATENT NO. : 7,525,348 B1
APPLICATION NO. : 10/907871
DATED : April 28, 2009
INVENTOR(S) : Ramsin M. Ziazadeh Page 1 of 1

It is certified that error appears in the above-identified patent and that said Letters Patent is hereby corrected as shown below:

Within Patent Claim 10,
At Column 7, Line 61, after "differential" please delete "put" and insert -- output -- in its place.

Signed and Sealed this

Second Day of June, 2009

JOHN DOLL
*Acting Director of the United States Patent and Trademark Office*